(12) United States Patent
Kuriyama et al.

(10) Patent No.: US 10,884,458 B2
(45) Date of Patent: Jan. 5, 2021

(54) ELECTRONIC DEVICE

(71) Applicant: Panasonic Intellectual Property Management Co., Ltd., Osaka (JP)

(72) Inventors: Futoshi Kuriyama, Saga (JP); Ryo Yonezawa, Kyoto (JP); Takeshi Mori, Osaka (JP); Tetsuya Urimoto, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/537,559

(22) Filed: Aug. 10, 2019

(65) Prior Publication Data

US 2019/0361503 A1    Nov. 28, 2019

Related U.S. Application Data

(63) Continuation of application No. PCT/JP2018/004536, filed on Feb. 9, 2018.

(30) Foreign Application Priority Data

Feb. 24, 2017  (JP) .................................. 2017-033859

(51) Int. Cl.
*G06F 1/16* (2006.01)
*H05K 5/00* (2006.01)
(Continued)

(52) U.S. Cl.
CPC .......... *G06F 1/1654* (2013.01); *G06F 1/1679* (2013.01); *G06F 1/1681* (2013.01);
(Continued)

(58) Field of Classification Search
CPC .... G06F 1/1654; G06F 1/1679; G06F 1/1681; H05K 5/0017; H05K 5/0086; H05K 5/0226
See application file for complete search history.

(56) References Cited

U.S. PATENT DOCUMENTS

| 5,400,213 A | 3/1995 | Honda |
| 5,430,608 A | 7/1995 | Honda |

(Continued)

FOREIGN PATENT DOCUMENTS

| JP | 05-189084 A | 7/1993 |
| JP | 10-115688 A | 5/1998 |

(Continued)

OTHER PUBLICATIONS

International Search Report for corresponding Application No. PCT/JP2018/004536, dated May 1, 2018.

(Continued)

*Primary Examiner* — Anthony M Haughton
(74) *Attorney, Agent, or Firm* — Renner, Otto, Boisselle & Sklar, LLP

(57) ABSTRACT

An electronic device in a first aspect includes: a housing comprising metal that houses an electronic component; a cover comprising resin that covers at least a part of a principal surface of the housing from an outside; and a screw screwed into the housing via a through-hole provided at the cover and, the screw having a head that protrudes to the outside from the cover. A larger-diameter part having a diameter larger than a diameter of a screw part is provided on a head side of the screw. A larger-diameter step-down part that fits the larger-diameter part is provided on the principal surface of the housing.

7 Claims, 14 Drawing Sheets

(51) Int. Cl.
*H05K 7/00* (2006.01)
*H05K 5/02* (2006.01)

(52) U.S. Cl.
CPC ......... *H05K 5/0017* (2013.01); *H05K 5/0086* (2013.01); *H05K 5/0226* (2013.01)

(56) References Cited

U.S. PATENT DOCUMENTS

| | | | |
|---|---|---|---|
| 5,444,601 A | 8/1995 | Honda | |
| 5,448,446 A | 9/1995 | Honda | |
| 6,532,152 B1* | 3/2003 | White | G02F 1/133308 361/692 |
| 7,983,028 B2* | 7/2011 | Park | H05K 5/02 345/905 |
| 8,096,994 B2* | 1/2012 | Phan | A61B 17/7065 606/249 |
| 10,627,858 B2* | 4/2020 | Seo | H04M 1/02 |
| 2007/0293005 A1* | 12/2007 | Shigenobu | G06F 1/1656 438/238 |
| 2010/0046155 A1 | 2/2010 | Kaneko | |
| 2012/0039058 A1* | 2/2012 | Kinjou | H01Q 1/2266 361/807 |
| 2014/0218855 A1 | 8/2014 | Fujino | |

FOREIGN PATENT DOCUMENTS

| | | |
|---|---|---|
| JP | 2005-332932 A | 12/2005 |
| JP | 2009-210991 A | 9/2009 |
| JP | 2010-049351 A | 3/2010 |
| JP | 2010-147092 A | 7/2010 |
| JP | 2012-038267 A | 2/2012 |
| JP | 2014-152837 A | 8/2014 |

OTHER PUBLICATIONS

"Purchase and repair diary of juck products from Hachisu Electric, Introduction of Panasonic Toughbook CF-18", [online], Jan. 4, 2015 [search date Apr. 10, 2018], internet: <URL:http://hasoft.blog27.fc2.com/blog-entry-46.html>.

* cited by examiner

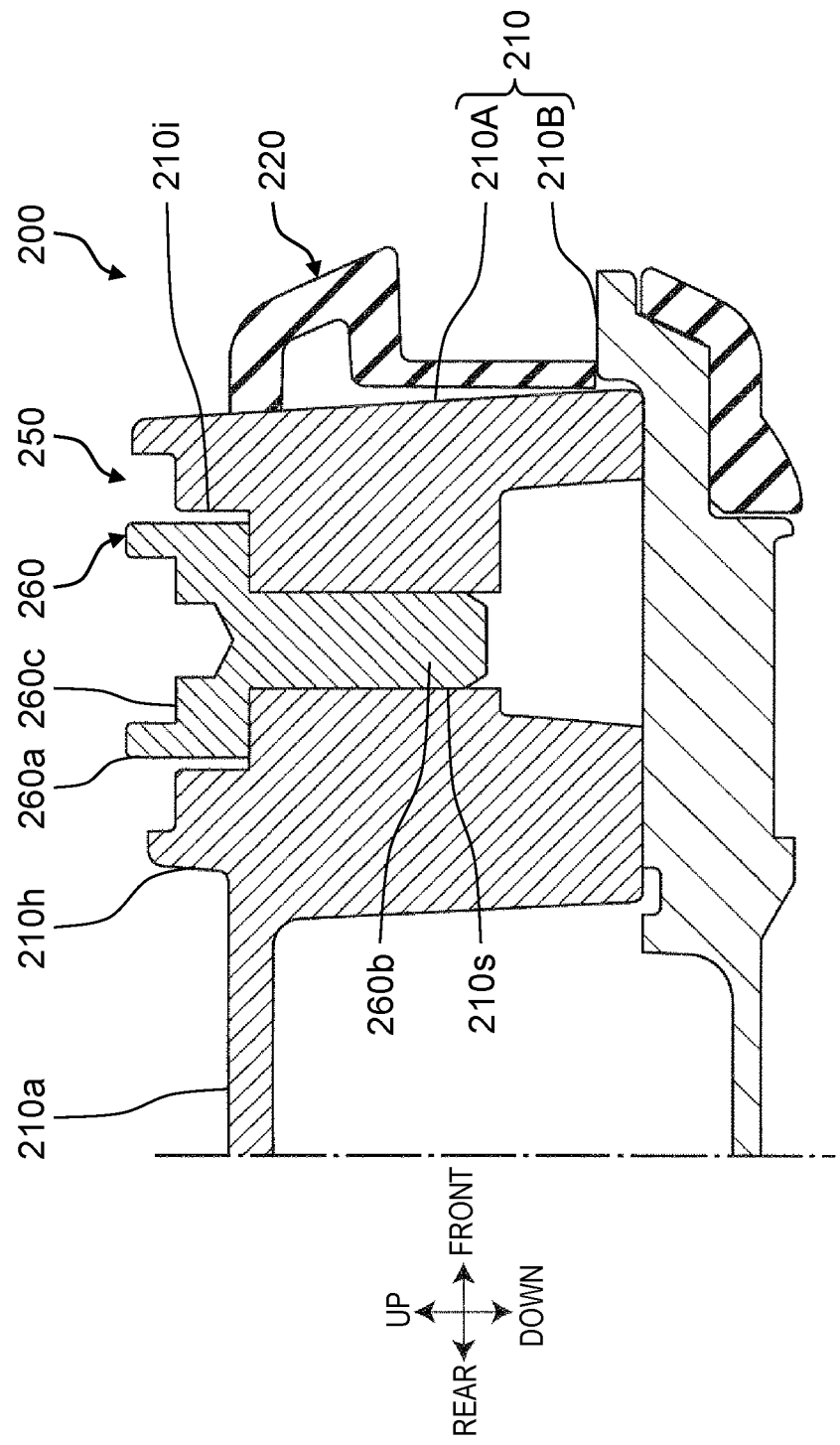

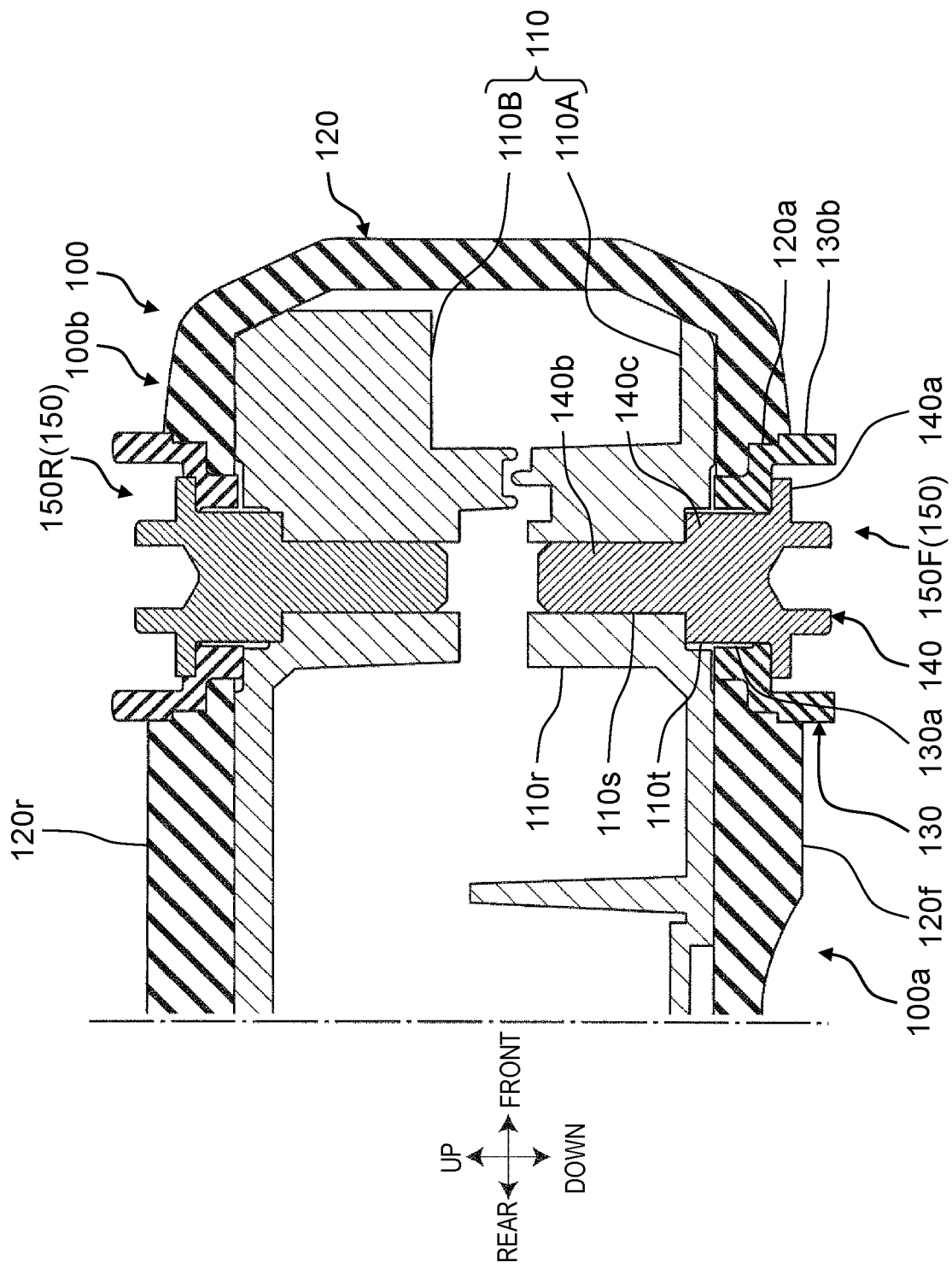

ELECTRONIC DEVICE

BACKGROUND

1. Technical Field

The present disclosure relates to an electronic device having a first unit and a second unit that are coupled to each other via hinges.

2. Description of the Related Art

PTL 1 discloses an electronic device having a main body and a display that are coupled to each other via hinges.

Here, PTL 1 is Unexamined Japanese Patent Publication No. H05-189084.

SUMMARY

The present disclosure provides an electronic device improved in resistance to impact at the time of falling, for example.

An electronic device in a first aspect of the present disclosure includes: a housing comprising metal that houses an electronic component; a cover comprising resin that covers at least a part of a principal surface of the housing from an outside; and a screw screwed into the housing via a through-hole provided at the cover and, the screw having a head that protrudes to the outside from the cover.

A larger-diameter part having a diameter larger than a diameter of a screw part is provided on a head side of the screw.

A larger-diameter step-down part that fits the larger-diameter part is provided on the principal surface of the housing.

An electronic device in a second aspect of the present disclosure includes: a first unit including a first electronic component and having a first principal surface; a second unit including a second electronic component and having a second principal surface; and a hinge that supports the first unit and the second unit relatively rotatably.

Relative rotation of the first unit and the second unit forms a closed state where the first principal surface of the first unit and the second principal surface of the second unit face each other.

A first fitting part provided on the first principal surface of the first unit and a first fitting part provided on the second principal surface of the second unit fit each other in the closed state.

One unit of the first unit and the second unit includes: a housing comprising metal; a cover comprising resin that covers at least a part of a principal surface of the housing from an outside; and a screw screwed into the housing via a through-hole provided at the cover and having a head that protrudes to the outside from the cover.

A larger-diameter part having a diameter larger than a diameter of a screw part is provided on a head side of the screw.

A larger-diameter step-down part that fits the larger-diameter part is provided on the principal surface of the housing.

One of the fitting parts of the one unit includes a portion that protrudes to the outside of the head of the screw.

According to the technique of the present disclosure, it is possible to provide an electronic device improved in resistance to impact at a time of falling, for example.

BRIEF DESCRIPTION OF DRAWINGS

FIG. 9A is a sectional view taken along line C-C in FIG. 6 and illustrates a cross section of the keyboard unit.

FIG. 9B is a sectional view taken along line C-C in FIG. 6 and illustrates a cross section of the tablet unit.

DETAILED DESCRIPTION

Exemplary embodiments will be described in detail below with reference to the accompanying drawings as appropriate. However, more detailed description than necessary may be omitted in some cases. For example, a detailed description of a well-known matter and a duplicated description of substantially the same configuration will be omitted in some cases. This is to avoid unnecessary redundancy in the following description and to facilitate understanding by those skilled in the art.

Here, the inventor of the present disclosure provides the accompanying drawings and the following description such that those skilled in the art can sufficiently understand the present disclosure, and therefore, does not intend to restrict the subject matters of claims by the accompanying drawings and the following description.

First Exemplary Embodiment

A first exemplary embodiment will be described below with reference to the drawings.

[1. Configuration]

[1-1. Outline]

Figure 1:
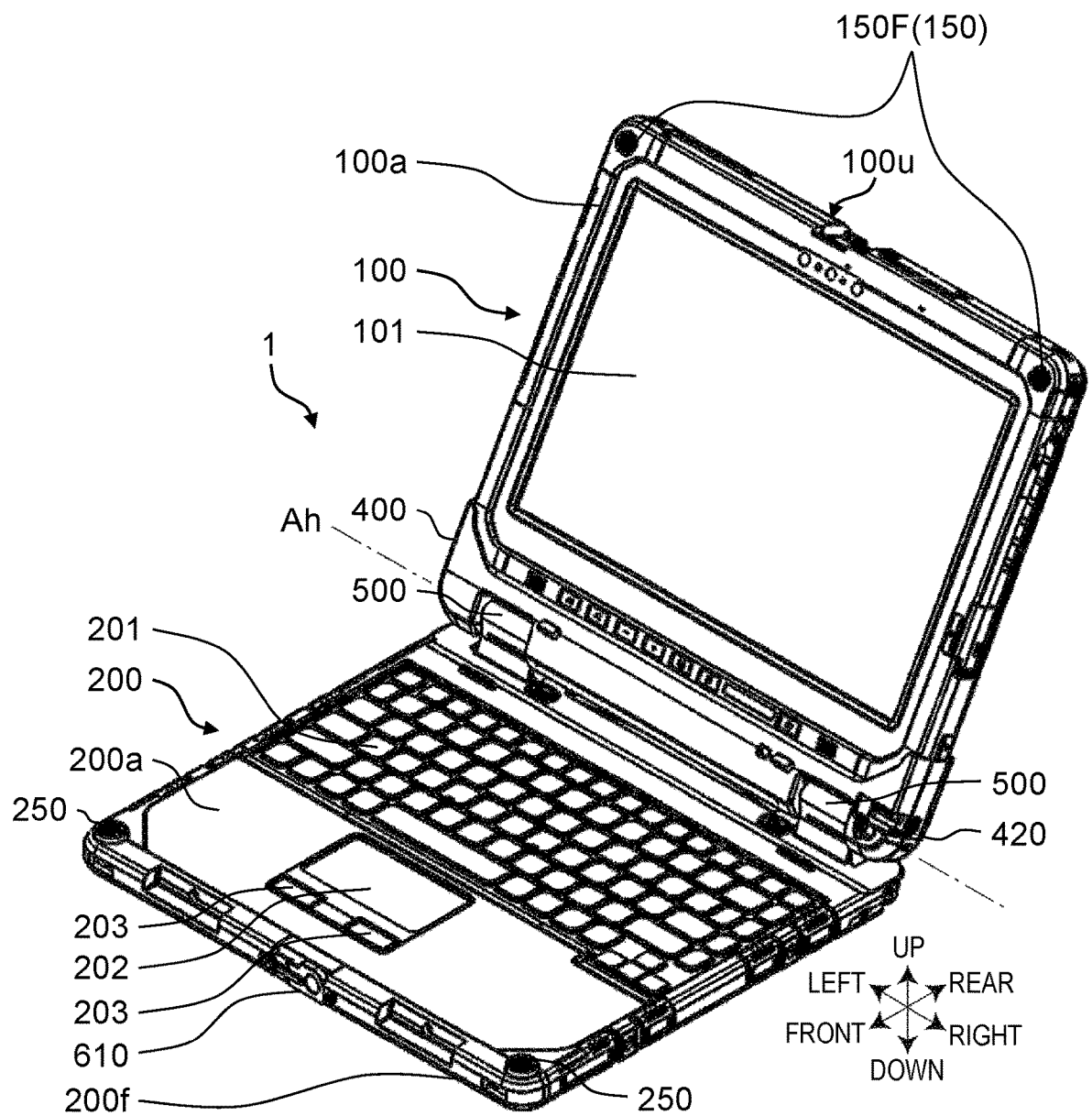
FIG. 1 is a perspective view of a computer according to a first exemplary embodiment and illustrates a state in which a tablet unit is opened.
Figure 2:
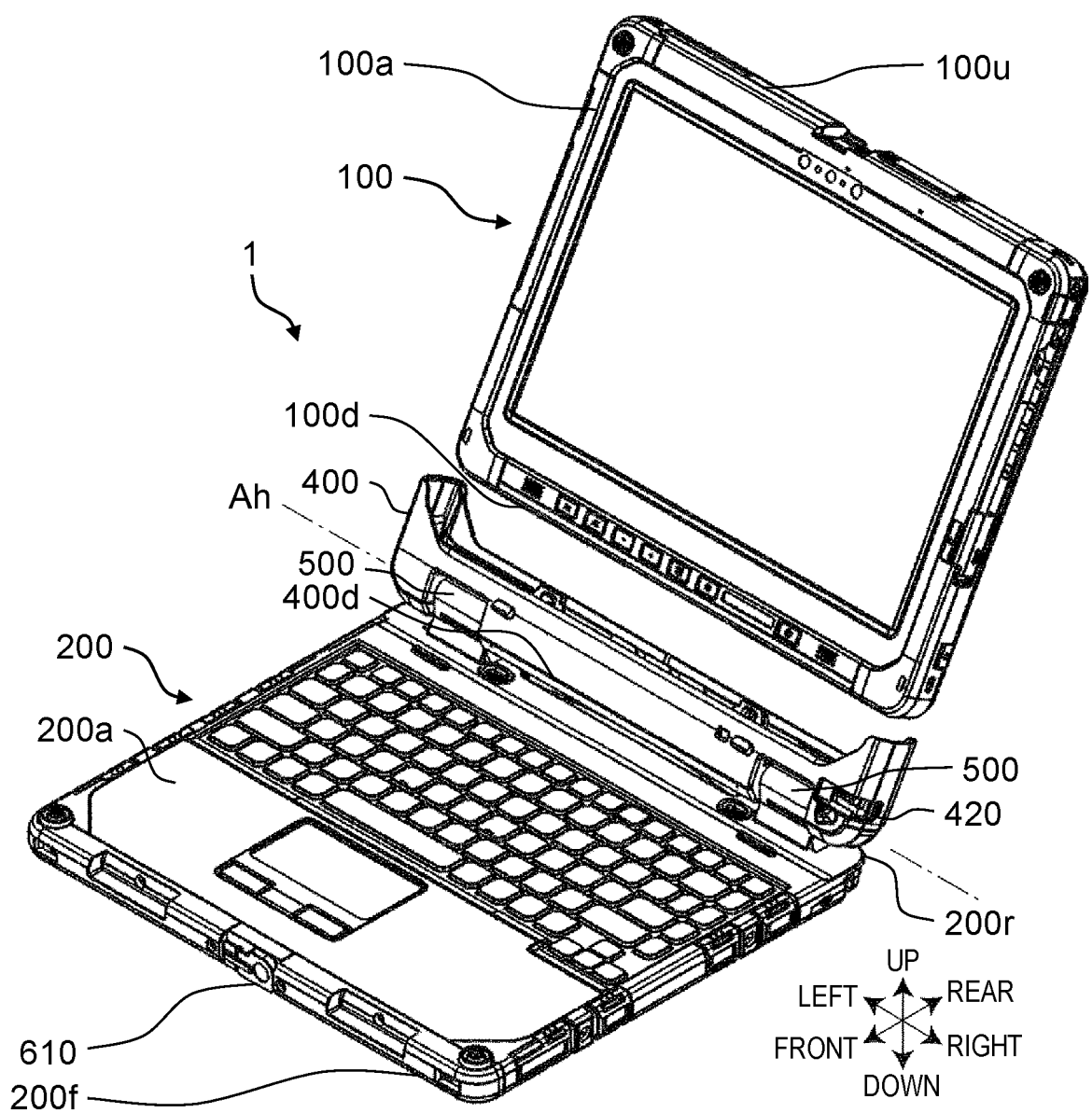
FIG. 2 is a perspective view of the computer and illustrates a state in which the tablet unit is detached.
Figure 3:
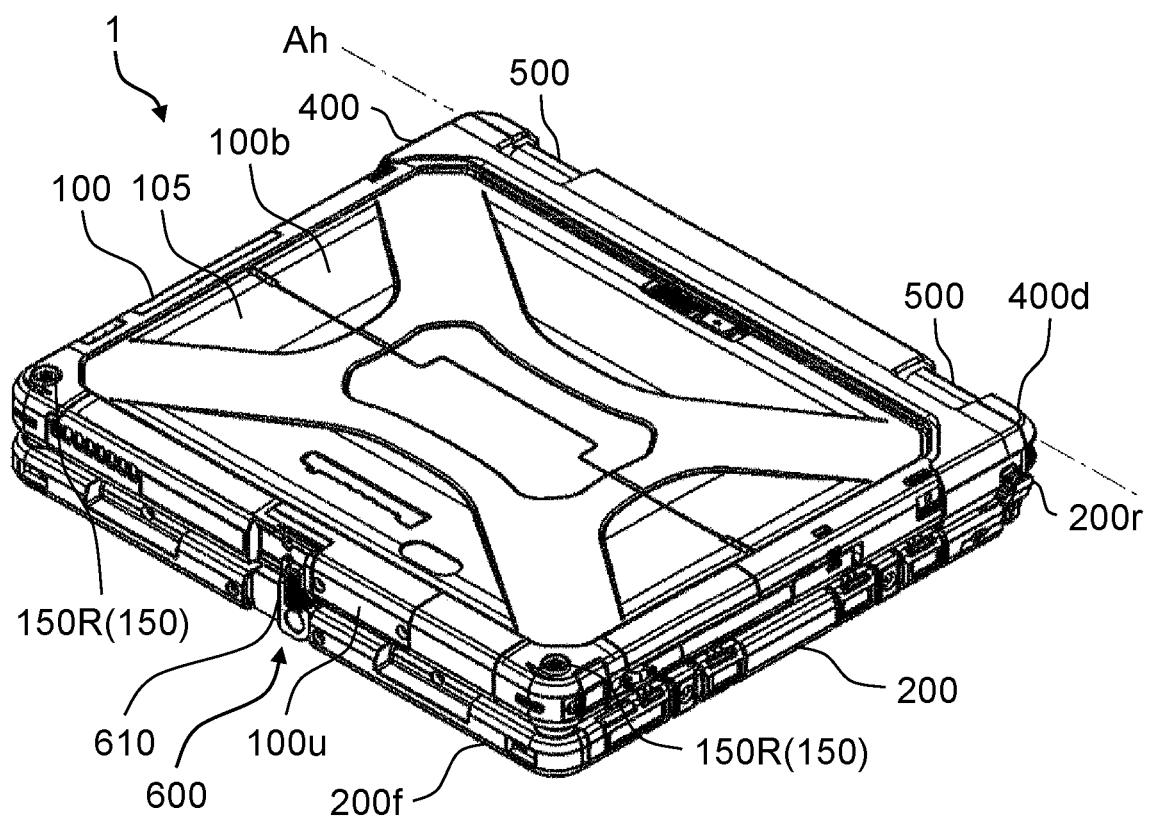
FIG. 3 is a perspective view of the computer and illustrates a state in which the tablet unit is closed.

FIGS. 1, 2, and 3 are perspective views of computer 1 according to the first exemplary embodiment. FIG. 1 illustrates a state in which tablet unit 100 is attached to keyboard unit 200. FIG. 2 illustrates a state in which tablet unit 100 is detached from keyboard unit 200. FIG. 3 illustrates a state in which tablet unit 100 is closed. In the drawings, directions are given as appropriate for convenience for the purpose of explanation and easier understanding. The directions are based on directions viewed by a user when computer 1 is utilized in a general utilization mode, but it is not intended that computer 1 should be used and disposed in these directions. In FIGS. 1 and 2, a left-right direction corresponds to a device width direction of tablet unit 100 and keyboard unit 200. Further, an up-down direction substantially corresponds to a device depth direction of tablet unit 100 and corresponds to a device thickness direction of keyboard unit 200. Further, a front-rear direction substantially corresponds to a device thickness direction of tablet unit 100 and corresponds to a device depth direction of keyboard unit 200.

Computer 1 has tablet unit 100 and keyboard unit 200. Computer 1 is an example of an electronic device. Tablet unit 100 is an example of an electronic device and a first unit. Keyboard unit 200 is an example of a second unit.

Tablet unit 100 includes display 101 on front surface 100a (first principal surface). Display 101 is composed of, for example, a liquid crystal display panel. Further, display 101 has a touch panel capable of receiving touch operation by a user. Various electronic components such as a central processing unit (CPU), a volatile storage device (RAM), a non-volatile storage device (e.g., ROM and SSD), and a communication module are contained in tablet unit 100. These electronic components are examples of first electronic components. Furthermore, a detachable battery that supplies electric power to these electronic components is contained in tablet unit 100. Openable cover 105 is provided on rear surface 100b of tablet unit 100 (see FIG. 3), and the battery can be detached by opening cover 105. In the nonvolatile storage device (such as the ROM and the SSD), an operating system (OS), various application programs, various data, and the like are stored. The central processing unit (CPU) reads the OS, the application programs, and the various data and performs arithmetic processing to achieve various functions in computer 1.

A housing of tablet unit 100 is made of, for example, resin or metal such as a magnesium alloy.

Holder 400 is coupled to keyboard unit 200 via hinges 500.

Keyboard unit 200 includes keyboard 201, touch pad 202, operation buttons 203, and the like on upper surface 200a (second principal surface). Further, keyboard unit 200 has an interface for transmitting and receiving data to and from tablet unit 100 and an external device interface for connection with an external device. Various electronic components such as a keyboard controller and a touch pad controller are contained in keyboard unit 200. These electronic components are examples of second electronic components.

A housing of keyboard unit 200 is made of, for example, resin or metal such as a magnesium alloy.

As illustrated in FIG. 2, holder 400 is coupled to side surface 200r on a rear side of keyboard unit 200 (hereinafter referred to as "rear side surface 200r" as appropriate) via hinges 500. As illustrated in FIG. 1, holder 400 can attach tablet unit 100. Further, as illustrated in FIG. 2, holder 400 can detach tablet unit 100 by operating operation lever 420.

Hinges 500 couple rear side surface 200r of keyboard unit 200 and side surface 400d on a lower side of holder 400 (hereinafter referred to as "lower side surface 400d" as appropriate). By hinges 500, keyboard unit 200 and holder 400 are relatively rotatable around rotation axis Ah parallel to a device width direction (left-right direction in FIG. 1) of computer 1. Note that this also means that hinges 500 couple rear side surface 200r of keyboard unit 200 and side surface 100d on a lower side of tablet unit 100 attached to holder 400 (hereinafter referred to as "lower side surface 100d" as appropriate). By hinges 500, keyboard unit 200 and tablet unit 100 are relatively rotatable around rotation axis Ah parallel to the width direction of computer 1. For example, as illustrated in FIG. 1, hinges 500 can allow tablet unit 100 to be opened at an angle of about 100 degrees with respect to keyboard unit 200. Also, as illustrated in FIG. 3, hinges 500 can allow tablet unit 100 to be closed with respect to keyboard unit 200. In the closed state, front surface 100a of tablet unit 100 and upper surface 200a of keyboard unit 200 closely face each other and are substantially parallel to each other.

Holder 400 is provided with a connector (not illustrated) that is connected with a connector (not illustrated) of tablet unit 100 with tablet unit 100 attached to holder 400. Various signals and electric power are given and received between tablet unit 100 and keyboard unit 200 via these connectors. For example, signals output from keyboard 201, touch pad 202, the plurality of operation buttons 203, and the like, of keyboard unit 200 can be output to tablet unit 100. Tablet unit 100 can receive these signals and perform control based on the received signals. Therefore, computer 1 can be utilized as a notebook type computer by attaching tablet unit 100 to keyboard unit 200. Further, tablet unit 100 can be utilized alone as a tablet type computer.

Additionally, computer 1 is provided with lock mechanism 600 that locks tablet unit 100 in keyboard unit 200 with tablet unit 100 closed by facing keyboard unit 200. Lock mechanism 600 is configured such that upper side surface 100u of tablet unit 100 and front side surface 200f of keyboard unit 200 are locked by latch 610.

[1-2. Impact Resistant Structure of Computer]

Figure 4:
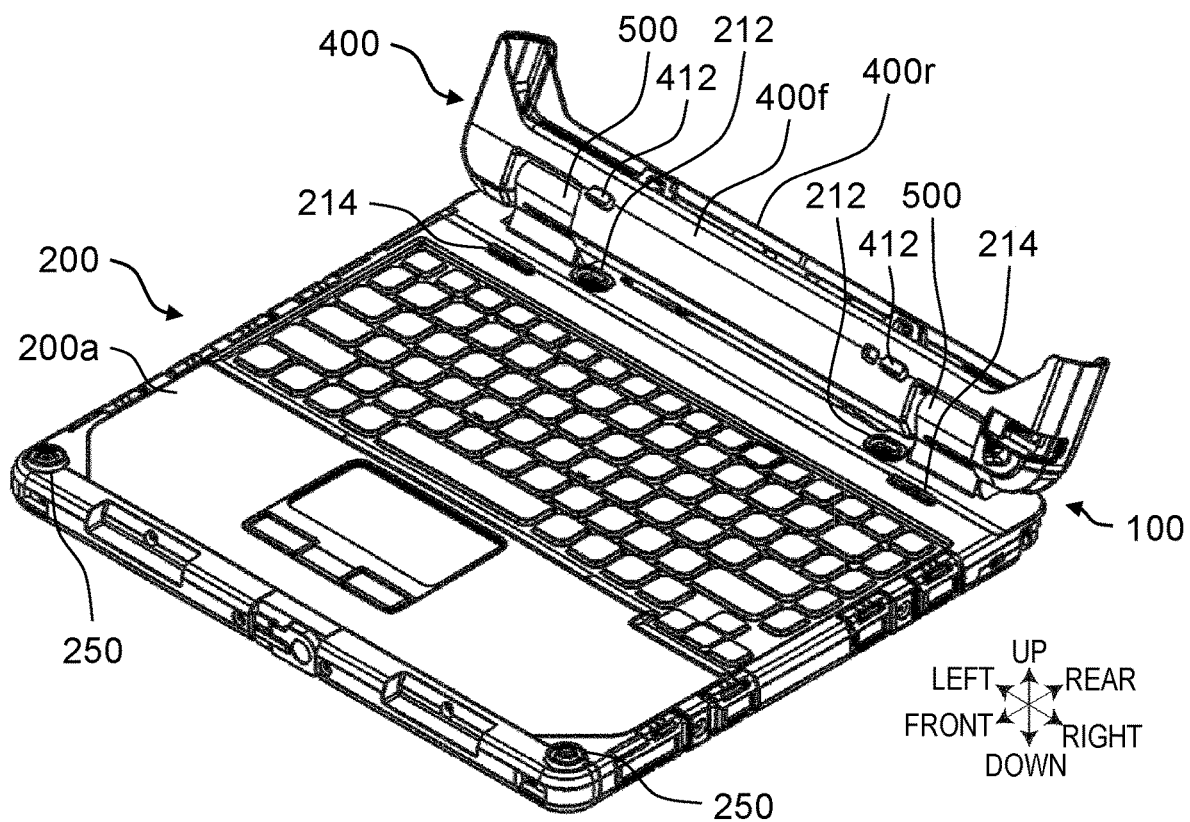
FIG. 4 is a perspective view of a keyboard unit.
Figure 5:
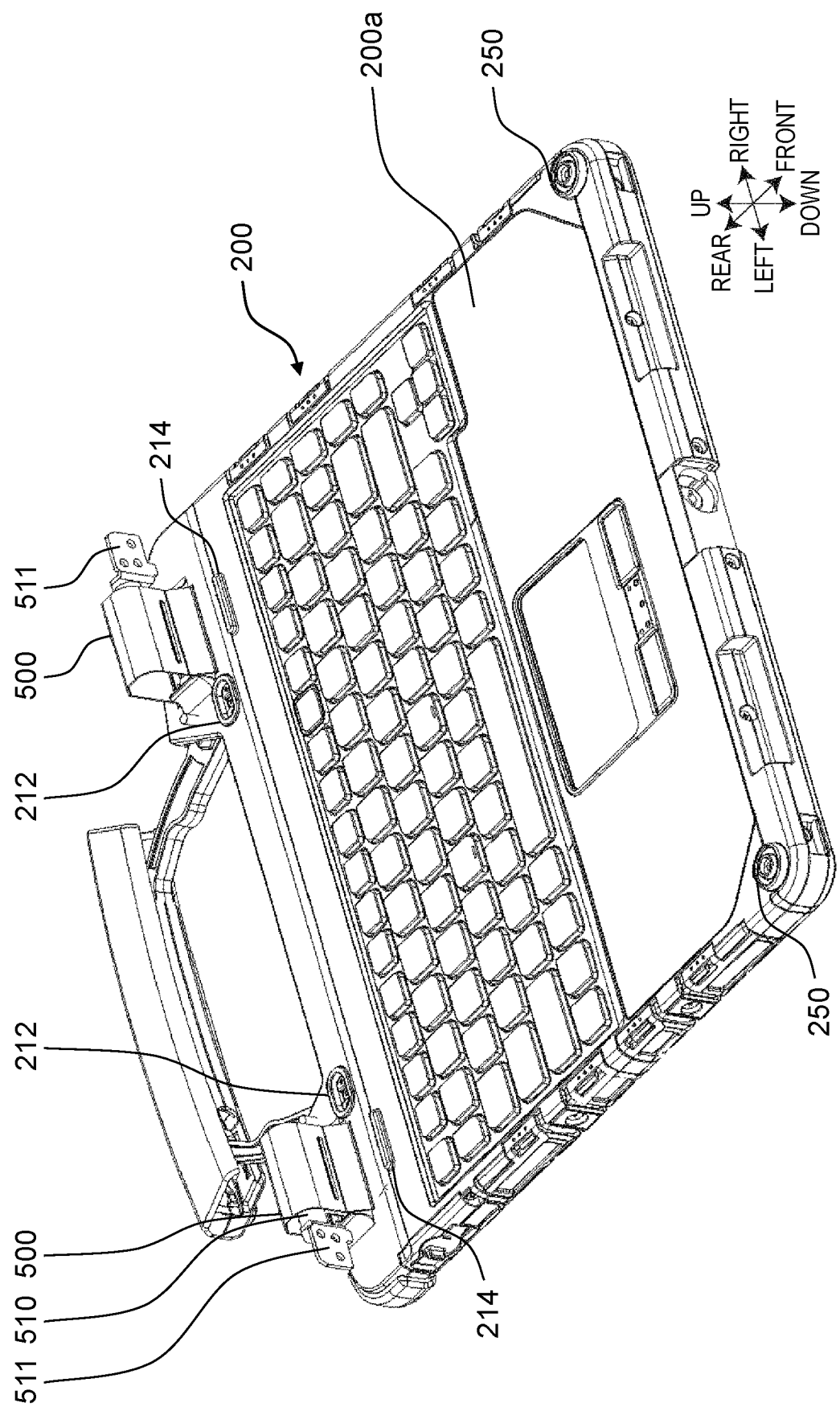
FIG. 5 is a perspective view of the keyboard unit and illustrates a state in which a holder is detached.

FIG. 4 is a perspective view of keyboard unit 200. FIG. 5 is a perspective view of keyboard unit 200 and illustrates a state in which holder 400 is detached.

As illustrated in FIG. 5, each hinge 500 has hinge shaft member 510 rotatably supported by the housing of keyboard unit 200 and bracket 511 firmly fixed to hinge shaft member 510 and to be fixed to holder 400. When computer 1 falls with tablet unit 100 attached to holder 400 of keyboard unit 200, holder 400 or hinge 500 may be deformed. This is because a load of tablet unit 100 and impact caused by vibration of tablet unit 100 within holder 400 are concentrated on a portion of holder 400 coupled to hinge 500 or a portion nearby. Computer 1 of the present exemplary embodiment has a structure for suppressing such deformation. The structure will be described below in detail with reference to FIG. 6 and afterwards in addition to FIGS. 4 and 5.

Figure 6:
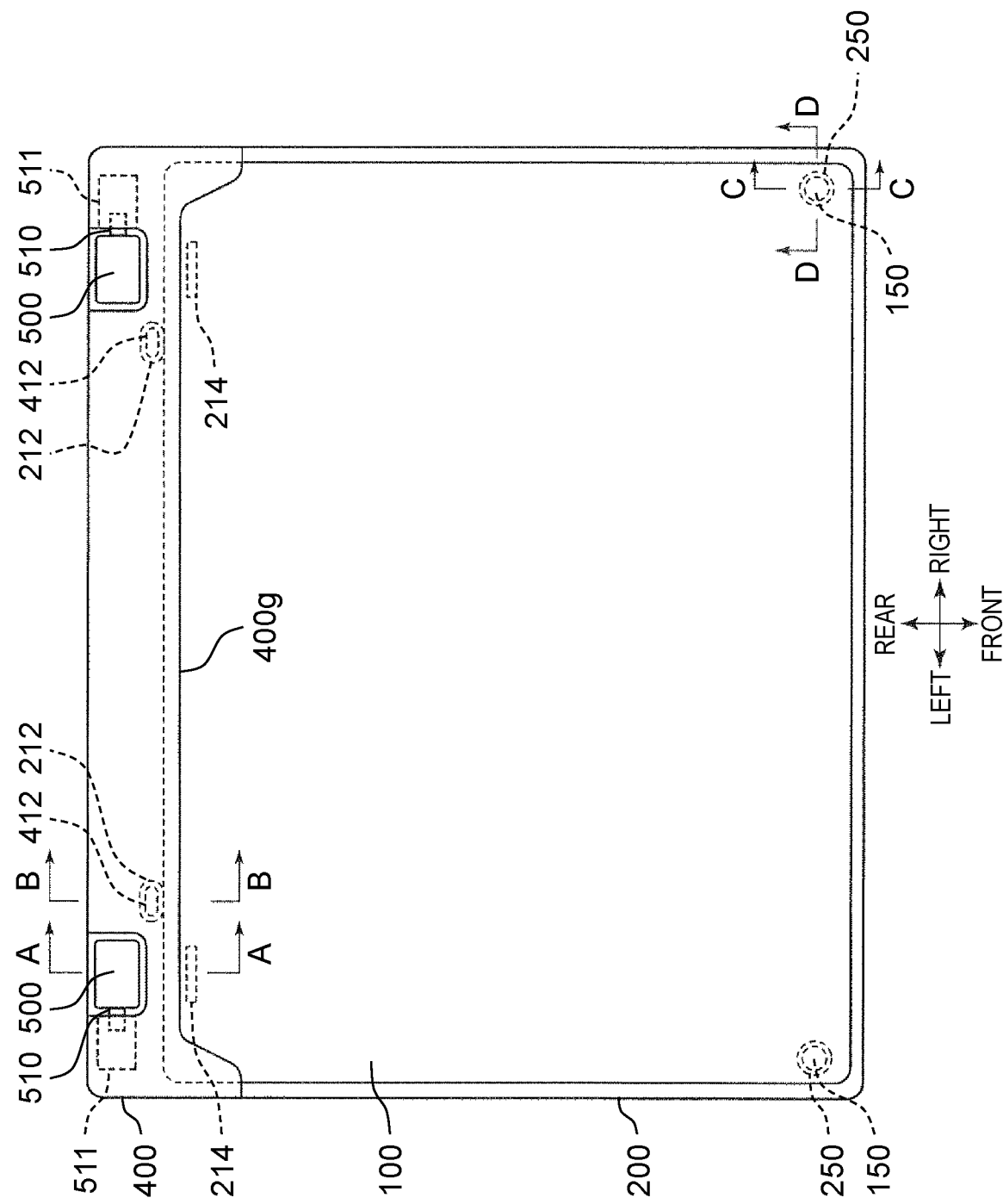
FIG. 6 is a plan view of the computer and illustrates a state in which the tablet unit is closed.
Figure 7:
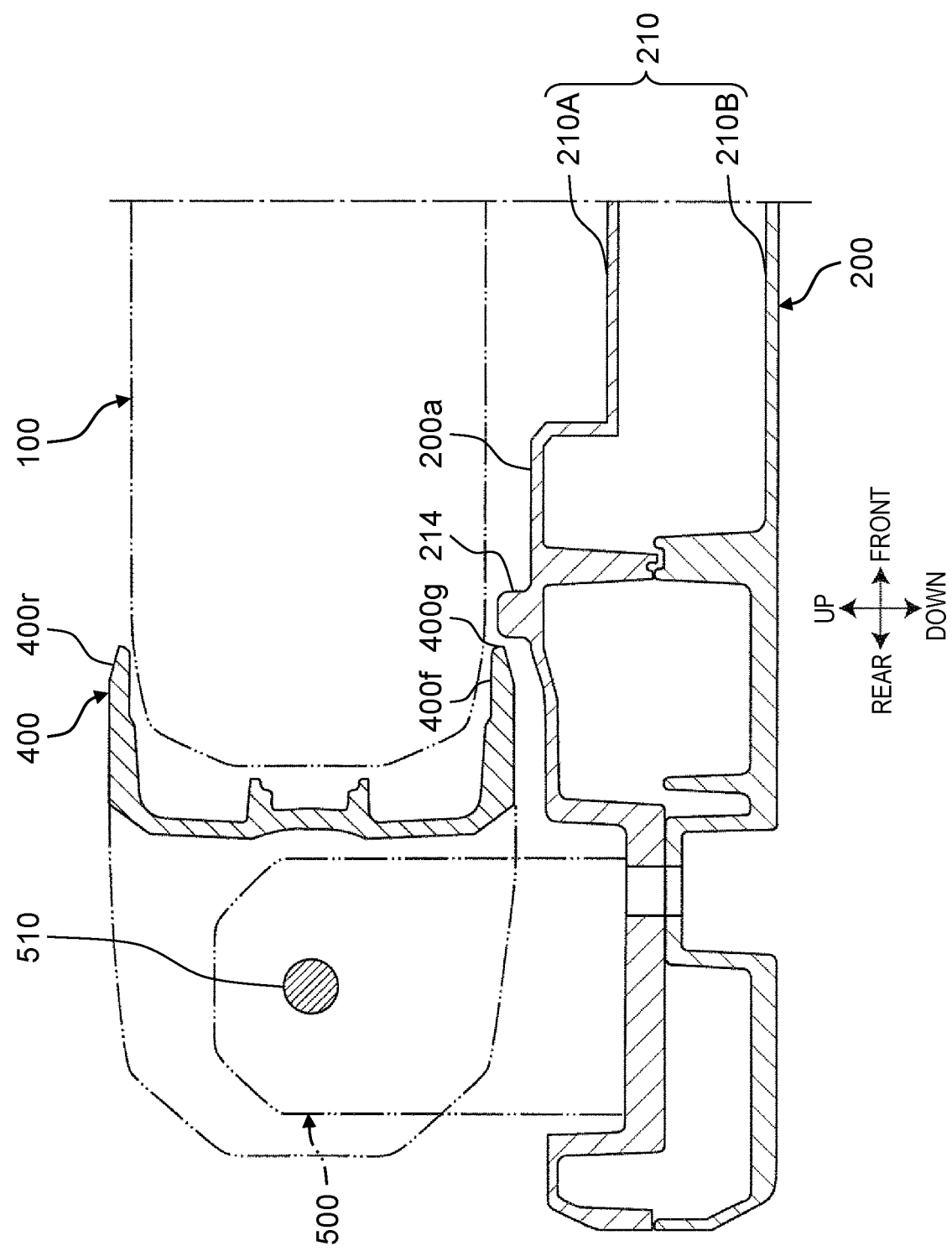
FIG. 7 is a sectional view taken along line A-A in FIG. 6.
Figure 8:
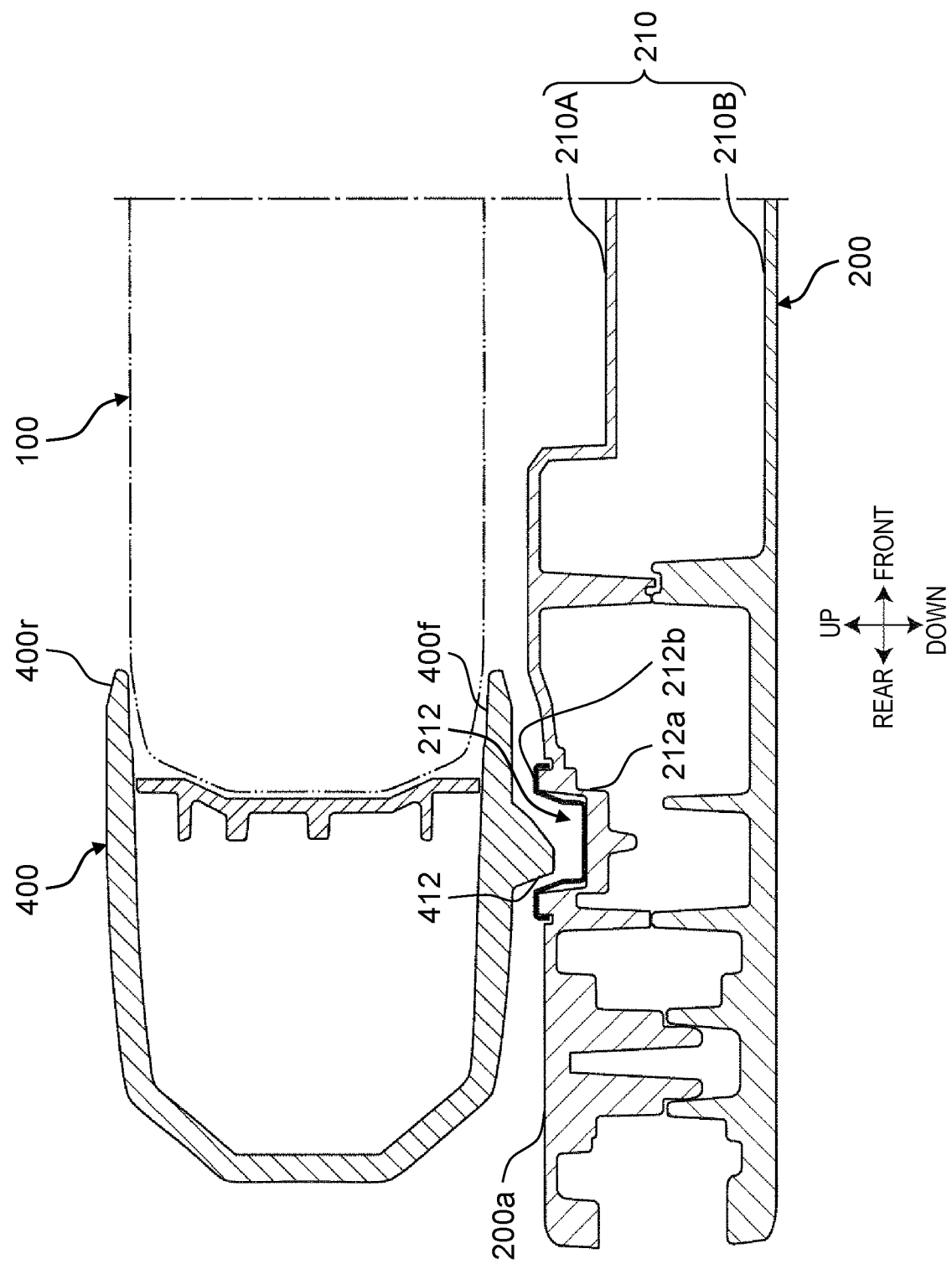
FIG. 8 is a sectional view taken along line B-B in FIG. 6.

FIG. 6 is a plan view of computer 1 and illustrates a state in which tablet unit 100 is closed. FIG. 7 is a sectional view taken along line A-A in FIG. 6. FIG. 8 is a sectional view taken along line B-B in FIG. 6.

As illustrated in FIGS. 4 and 5, keyboard unit side ribbed projections 214 extending in the device width direction are respectively provided near hinges 500 on a rear side of upper surface 200a of keyboard unit 200. As illustrated in FIG. 7, keyboard unit side ribbed projection 214 protrudes in a rib shape from upper surface 200a of housing 210 of keyboard unit 200. Note that housing 210 includes upper housing 210A and lower housing 210B. Further, as illustrated in FIGS. 6 and 7, keyboard unit side ribbed projections 214 are formed to be located near a front end of end 400g of holder 400 with upper surface 200a of keyboard unit 200 and front surface 400f of holder 400 being substantially parallel to each other.

As illustrated in FIG. 4, holder 400 has front surface 400f and rear surface 400r. Holder side fitting parts 412 are respectively formed near hinges 500 on front surface 400f of holder 400. As illustrated in FIG. 8, holder side fitting part 412 is formed as a protrusion protruding from front surface 400f of holder 400. Holder side fitting part 412 has a trapezoidal cross section.

As illustrated in FIGS. 4 and 5, keyboard unit side second fitting parts 212 are respectively formed near hinges 500 on upper surface 200a of keyboard unit 200. As illustrated in FIG. 8, keyboard unit side second fitting part 212 is formed to fit holder side fitting part 412 of holder 400 with upper surface 200a of keyboard unit 200 and front surface 400f of holder 400 being substantially parallel to each other (a state in which keyboard unit 200 is closed). Keyboard unit side second fitting part 212 has a recess that can fit holder side fitting part 412. Keyboard unit side second fitting part 212 has recess 212a formed in housing 210 and recessed recess cover 212b fitted in recess 212a and fixed with screws (not illustrated).

Figure 9C:
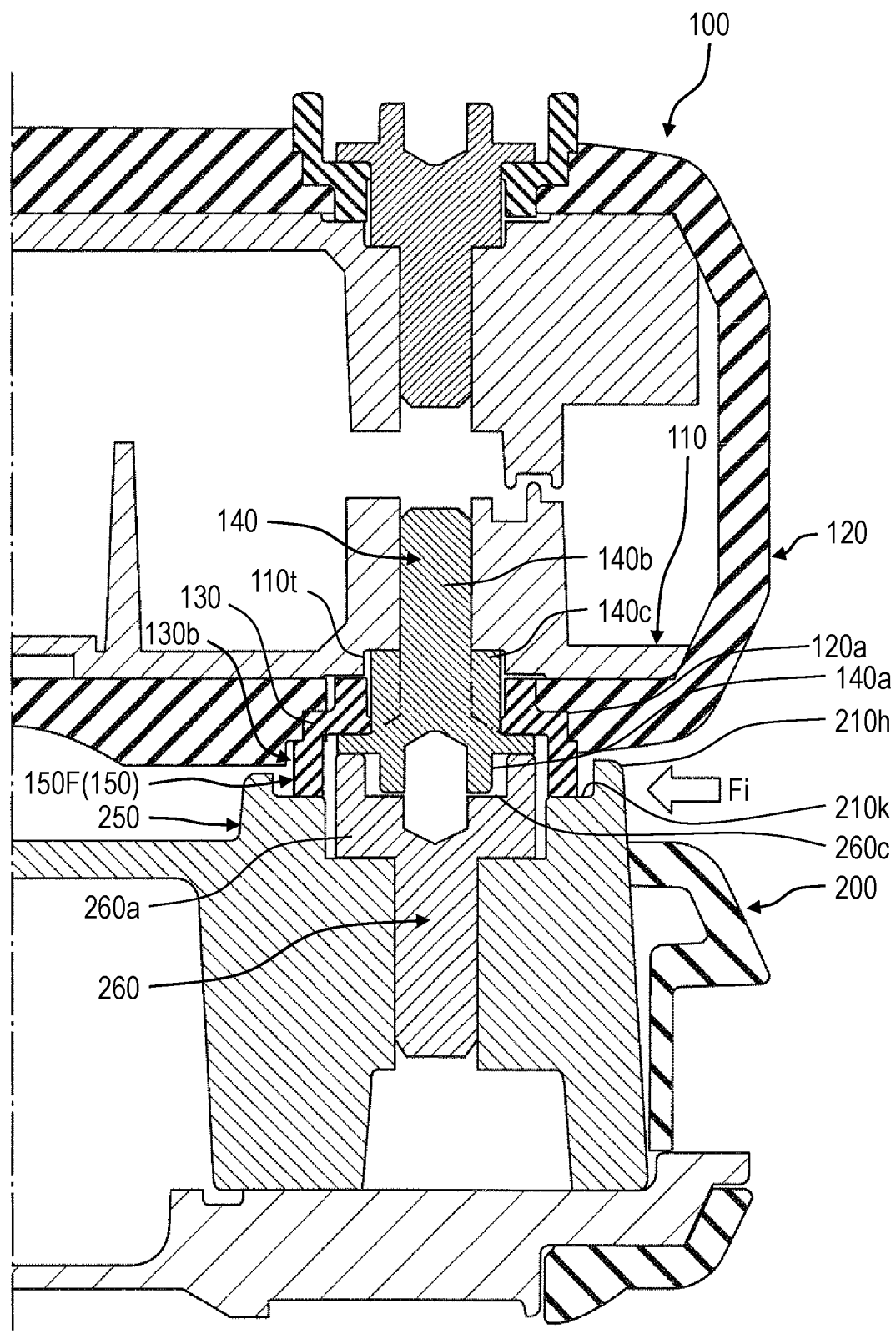
FIG. 9C is a sectional view taken along line C-C in FIG. 6 and illustrates a state in which the tablet unit is closed on the keyboard unit.

FIG. 9A is a sectional view taken along line C-C in FIG. 6 and illustrates a cross section of keyboard unit 200. FIG. 9B is a sectional view taken along line C-C in FIG. 6 and illustrates a cross section of tablet unit 100. FIG. 9C is a sectional view taken along line C-C in FIG. 6 and illustrates a state in which tablet unit 100 is closed on keyboard unit 200.

In the present exemplary embodiment, as illustrated in FIG. 1, right and left tablet unit side fitting parts 150F are provided on front surface 100a of tablet unit 100 near upper side surface 100u. Tablet unit side fitting parts 150F each have a circular shape in a front view. In the present exemplary embodiment, tablet unit 100 is attachable to holder 400 with tablet unit 100 turned over (a state in which rear surface 100b of tablet unit 100 faces front). Thus, as illustrated in FIGS. 3 and 9B, tablet unit side fitting parts 150R are also provided on rear surface 100b of tablet unit 100. Tablet unit side fitting parts 150F and 150R basically have an identical structure. Accordingly, hereinafter, tablet unit side fitting part 150F will be described as a representative and referred to as "tablet unit side fitting part 150" as appropriate.

Further, as illustrated in FIGS. 1, 4, and 5, keyboard unit side first fitting parts 250 are formed on upper surface 200a of keyboard unit 200. As illustrated in FIGS. 6 and 9C, keyboard unit side first fitting part 250 is formed to fit tablet unit side fitting part 150 of tablet unit 100 with upper surface 200a of keyboard unit 200 and front surface 100a of tablet unit 100 being substantially parallel to each other (the state in which keyboard unit 200 is closed). Keyboard unit side first fitting part 250 is formed in a circular shape in the front view.

As illustrated in FIG. 9A, keyboard unit side first fitting part 250 has screw 260, protrusion 210h, screw hole 210s, and step-down part 210i. Protrusion 210h protrudes from upper surface 200a of housing 210. Screw hole 210s passes through protrusion 210h in the device thickness direction. Screw part 260b of screw 260 is screwed into screw hole 210s. Step-down part 210i is provided at an upper part of screw hole 210s, and head 260a of screw 260 is fit in step-down part 210i. Recess 260c is provided on an upper surface of head 260a of screw 260.

Figure 10A:
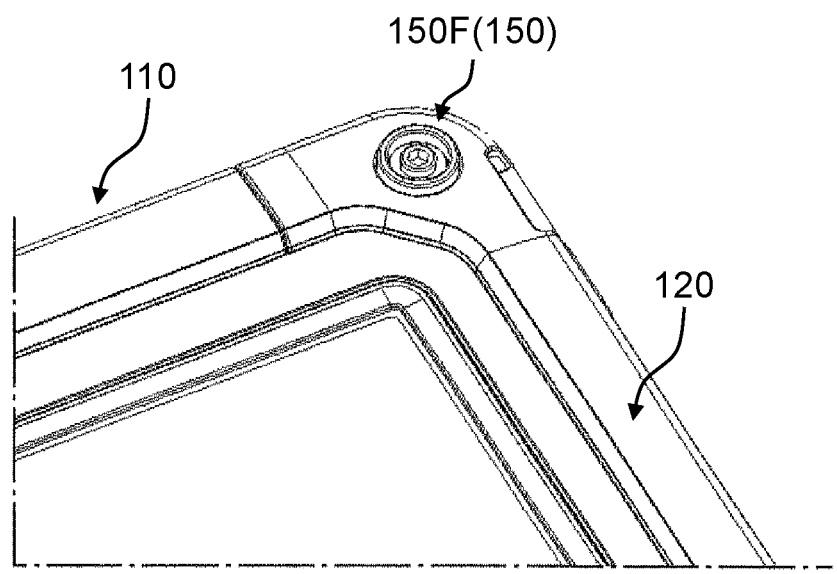
FIG. 10A is an enlarged perspective view of a portion of a tablet unit side fitting part and illustrates a state of the tablet unit side fitting part viewed from a lower left side.
Figure 10B:
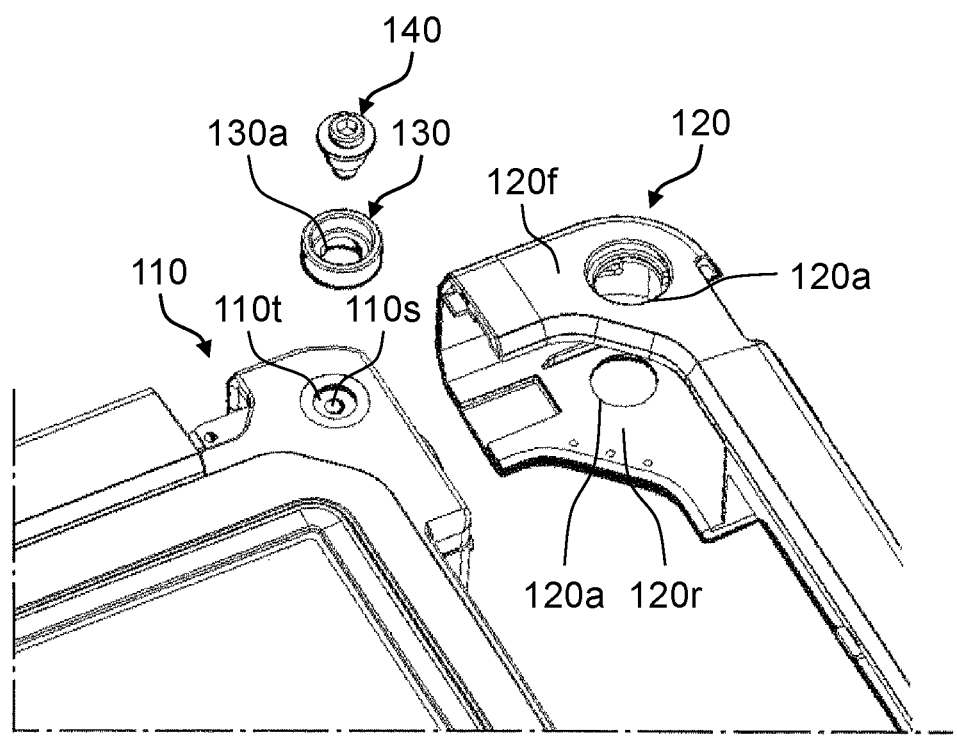
FIG. 10B is an exploded perspective view of the tablet unit side fitting part.

FIG. 10A is an enlarged perspective view of a portion of tablet unit side fitting part 150F (150) on a right side of tablet unit 100 and illustrates a state of tablet unit side fitting part 150 viewed from a lower left side. FIG. 10B is an exploded perspective view of constituent members of a portion of identical tablet unit side fitting part 150.

As illustrated in FIGS. 10A and 10B, the right side of tablet unit 100 is covered with side cover 120. Tablet unit side fitting part 150 has screw 140 and screw receiving member 130.

Through-hole 120a in which screw receiving member 130 is disposed is provided at corners of front surface 120f and rear surface 120r of side cover 120. Side cover 120 is made of resin.

Screw receiving member 130 is a ring-shaped member and is provided with through-hole 130a into which screw 140 is inserted. Screw receiving member 130 is formed of elastomer.

As illustrated in FIG. 9B, screw receiving member 130 is fit into through-hole 120a of side cover 120. Screw 140 is screwed into screw hole 110s of housing 110 of tablet unit 100 via through-hole 130a of screw receiving member 130. Note that housing 110 includes front housing 110A and rear housing 110B.

Larger-diameter step-down part 110t stepped down from a side of front surface 100a and having a diameter larger than a diameter of screw hole 110s is provided to screw hole 110s of housing 110 on a side closer to front surface 100a. Further, larger-diameter part 140c having a diameter larger than a diameter of screw part 140b is provided adjacent to head 140a of screw 140. In other words, screw 140 has head 140a, screw part 140b, and larger diameter part 140c between head 140a and screw part 140b. Moreover, larger-diameter part 140c of screw 140 fits in larger-diameter step-down part 110t of housing 110 and through-hole 130a of screw receiving member 130.

As illustrated in FIG. 9C, when tablet unit 100 is closed on keyboard unit 200, tablet unit side fitting part 150 of tablet unit 100 fits in keyboard unit side first fitting part 250 of keyboard unit 200. At this time, head 140a of screw 140 of tablet unit side fitting part 150 fits in recess 260c of head 260a of screw 260 of keyboard unit side first fitting part 250. Further, larger-diameter ring 130b of screw receiving member 130 abuts on upper surface 210k of protrusion 210h of keyboard unit side first fitting part 250.

Figure 11:
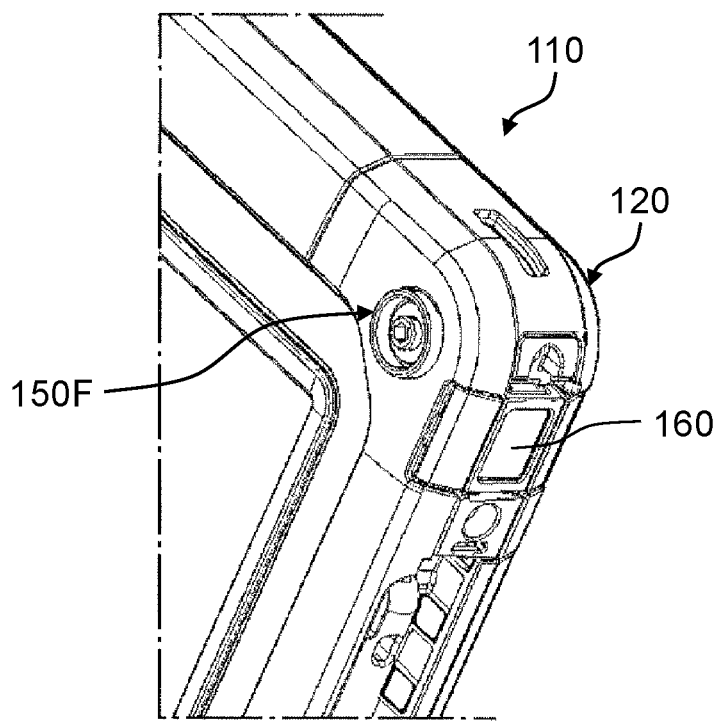
FIG. 11 is an enlarged perspective view of a portion of the tablet unit side fitting part and illustrates a state of the tablet unit side fitting part viewed from an upper right side.
Figure 12:
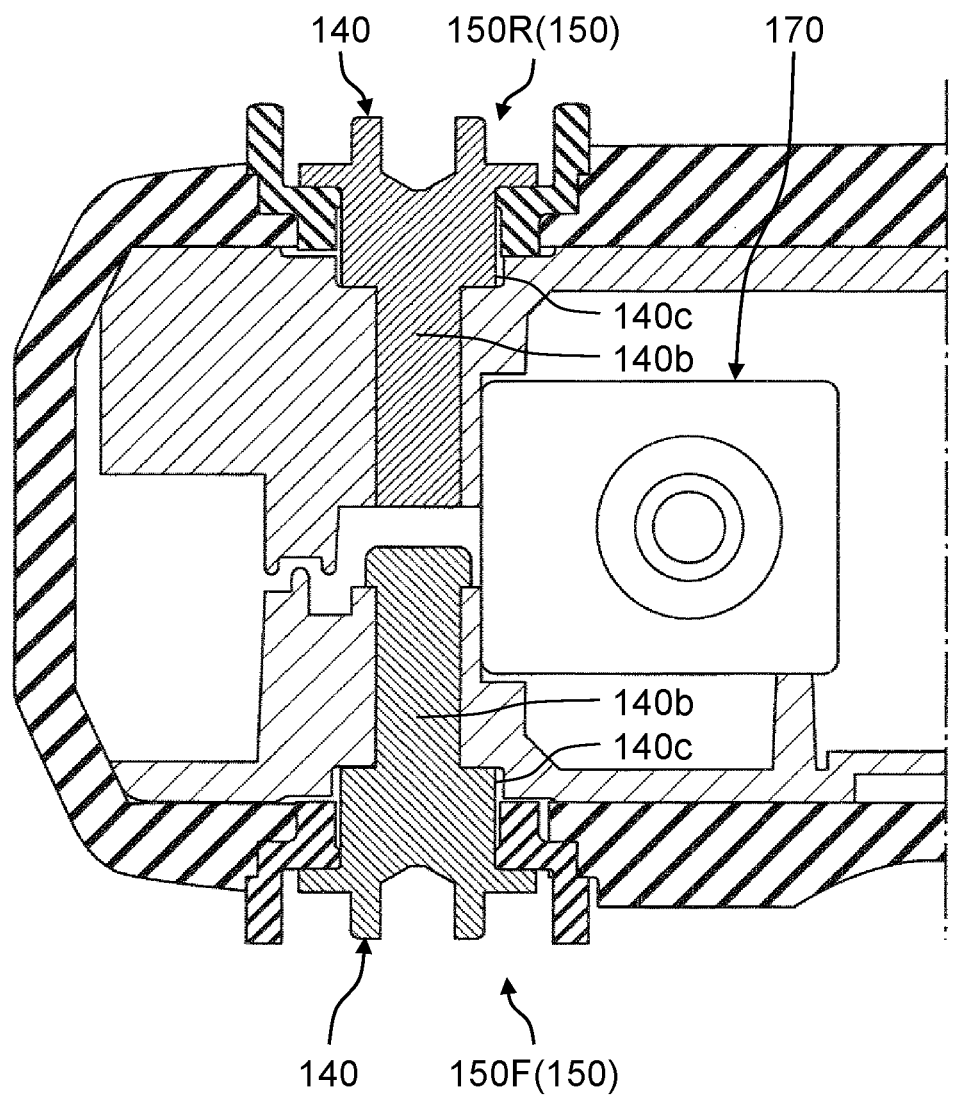
FIG. 12 is a sectional view of the portion of the tablet unit side fitting part.

With reference to FIGS. 11 and 12, a reason why screw 140 has the above-described structure will be described. FIG. 11 is an enlarged perspective view of a portion provided with tablet unit side fitting part 150F (150) and illustrates a state of tablet unit side fitting part 150 viewed from an upper right side. FIG. 12 is a sectional view of the portion of tablet unit side fitting part 150.

As illustrated in FIG. 11, lid 160 for a power connector is provided at an upper right portion of tablet unit 100, in addition to tablet unit side fitting part 150F (150). As illustrated in FIG. 12, power connector 170 is housed inside lid 160. Because of layout of other various parts housed in tablet unit 100, it is necessary that power connector 170 is disposed near screw 140. In such a case, if screw 140 is simply thinned as illustrated by an imaginary line in FIG. 9C to prevent interference with the other parts, strength of screw 140 may become insufficient. For example, keyboard unit 200 and tablet unit 100 are relatively displaced in the device width direction by receiving impact force Fi of more than or equal to certain strength from a side. At this time, impact force Fi is transmitted from head 260a of screw 260 of keyboard unit 200 to head 140a of screw 140 of tablet unit 100. Screw part 140b of screw 140 of tablet unit 100 may be bent or sheared by this impact force Fi.

To avoid the bending or shearing, in the present exemplary embodiment, screw 140 of tablet unit side fitting part 150 has larger-diameter part 140c having the diameter larger than the diameter of screw part 140b adjacent to head 140a of screw 140. Furthermore, larger-diameter part 140c of screw 140 fits in larger-diameter step-down part 110t of housing 110. Therefore, impact force Fi transmitted to head 140a of screw 140 can be received by larger-diameter step-down part 110t of housing 110. Bending or shearing of screw 140 can be thus suppressed.

Additionally, ring-shaped screw receiving member 130 (elastic member) made of elastomer is provided between through-hole 120a of side cover 120 and larger-diameter part 140c. Impact applied from side cover 120 to screw 140 is thereby suppressed. As a result, the bending or shearing of screw 140 can be further suppressed.

[1-3. Action]

For example, description will be given of a case where computer 1 falls with a side of hinge 500 facing down when tablet unit 100 is attached to holder 400 of keyboard unit 200 and tablet unit 100 and keyboard unit 200 are closed.

When tablet unit 100 is attached to holder 400 and is closed on keyboard unit 200, as illustrated in FIG. 6, keyboard unit side second fitting part 212 and holder side fitting part 412 disposed on a side of each hinge 500 fit each other. Accordingly, when computer 1 falls in this state, a load of tablet unit 100 and impact caused by vibration of tablet unit 100 within holder 400 are dispersed from holder side fitting parts 412 to keyboard unit 200 via keyboard unit side second fitting parts 212. As a result, impact applied to a portion of holder 400 coupled to hinge 500 and a portion nearby can be reduced. Hence, deformation of holder 400 or hinge 500 due to the impact can be suppressed.

Further, as illustrated in FIG. 7, in the above-described closed state, keyboard unit side ribbed projection 214 is located near the front of end 400g of holder 400. Accordingly, displacement of holder 400 to the front with respect to keyboard unit 200 is prevented by abutting end 400g of holder 400 on keyboard unit side ribbed projection 214. As a result, the impact applied to the portion of holder 400 coupled to hinge 500 and the portion nearby can be further reduced. Hence, the deformation of holder 400 or hinge 500 due to the impact can be even more suppressed.

Furthermore, as illustrated in FIG. 9C, in the above-described closed state, tablet unit side fitting part 150 and keyboard unit side first fitting part 250 fit each other. Accordingly, the above-described impact is dispersed to keyboard unit 200 via tablet unit side fitting part 150 and keyboard unit side first fitting part 250. As a result, the impact applied to the portion of holder 400 coupled to hinge 500 and the portion nearby can be even more reduced. Hence, the deformation of holder 400 or hinge 500 due to the impact can be even more suppressed.

Further, as illustrated in FIG. 6, the above-described fitting structure is formed near each of the four corners on the upper surface of keyboard unit 200. Accordingly, relative rotation of keyboard unit 200 and tablet unit 100 around an axis perpendicular to the upper surface is suppressed. With this configuration, twisting force applied to holder 400 and hinge 500 is also suppressed, and the deformation of holder 400 or hinge 500 can be even more suppressed.

Furthermore, as described above, the above effects can be obtained while suppressing the bending or shearing of screw 140 of tablet unit side fitting part 150.

[2. Effects and Other Benefits]

Tablet unit 100 (an example of an electronic device) in the present exemplary embodiment includes: housing 110 made of a magnesium alloy (for example, made of metal) that houses electronic components; side cover 120 (cover) made of resin that covers at least a part of front surface 100a (principal surface) of housing 110 from an outside; and screw 140 screwed into housing 110 via through-hole 120a provided at side cover 120 (cover) and having head 140a that protrudes to the outside from side cover 120.

Larger-diameter part 140c having a diameter larger than a diameter of screw part 140b is provided adjacent to head 140a of screw 140.

Larger-diameter step-down part 110t that fits larger-diameter part 140c is provided on front surface 100a (principal surface) of housing 110.

Resistance to impact at a time of falling, for example, can be thereby improved.

Computer 1 (an example of an electronic device) in the present exemplary embodiment includes: tablet unit 100 (an example of a first unit) including first electronic components and having front surface 100a (first principal surface); keyboard unit 200 (an example of a second unit) including second electronic components and having upper surface 200a (second principal surface); and hinges 500 that support tablet unit 100 and keyboard unit 200 relatively rotatably.

By relatively rotating tablet unit 100 and keyboard unit 200, it is possible to form a closed state where front surface 100a (first principal surface) of tablet unit 100 and upper surface 200a (second principal surface) of keyboard unit 200 face each other.

Tablet unit side fitting part 150 and keyboard unit side first fitting part 250 (fitting parts) that fit each other in the closed state are respectively provided on front surface 100a (first principal surface) of tablet unit 100 and upper surface 200a (second principal surface) of keyboard unit 200.

Tablet unit 100 (one unit) of tablet unit 100 and keyboard unit 200 includes: housing 110 made of a magnesium alloy (for example, made of metal); side cover 120 (cover) made of resin that covers at least a part of front surface 100a (principal surface) of housing 110 from an outside; and screw 140 screwed into housing 110 via through-hole 120a provided at side cover 120 and having head 140a that protrudes to the outside from side cover 120.

Larger-diameter part 140c having a diameter larger than a diameter of screw part 140b is provided adjacent to head 140a of screw 140.

Larger-diameter step-down part 110t that fits larger-diameter part 140c is provided on front surface 100a (principal surface) of housing 110.

Tablet unit side fitting part 150 of tablet unit 100 (fitting part of one unit) includes a portion that protrudes to the outside of head 140a of screw 140.

Accordingly, it is possible to provide an electronic device improved in resistance to impact at a time of falling, for example.

Further, in the electronic device according to the present exemplary embodiment, ring-shaped screw receiving member 130 (elastic member) is provided between through-hole 120a of side cover 120 and larger-diameter part 140c.

Impact applied from side cover 120 to screw 140 can be thereby suppressed. As a result, resistance to the impact at a time of falling, for example, can be further improved.

In the electronic device according to the present exemplary embodiment, holder 400 detachable from tablet unit 100 is coupled to keyboard unit 200 via hinges 500.

Hinges 500 support tablet unit 100 and keyboard unit 200 attached to holder 400 relatively rotatably.

The electronic device detachable from tablet unit 100 can thereby obtain the above effect. In the electronic device detachable from tablet unit 100, impact caused by vibration of tablet unit 100 within holder 400 is likely to be large at the time of falling, for example. However, in the present exemplary embodiment, resistance to such impact can be improved.

In the electronic device according to the present exemplary embodiment, upper surface 200a (second principal surface) of keyboard unit 200 and front surface 400f (third principal surface) of holder 400 face each other in the closed state.

Holder side fitting part 412 and keyboard unit side second fitting part 212 (second fitting parts) that fit each other in the closed state are respectively provided on upper surface 200a (second principal surface) of keyboard unit 200 and front surface 400f (third principal surface) of holder 400.

Relative displacement between tablet unit 100 and keyboard unit 200 caused by impact at a time of falling, for example, can be thereby suppressed. As a result, resistance to the impact at the time of falling, for example, can be further improved.

In the electronic device according to the present exemplary embodiment, upper surface 200a (second principal surface) of keyboard unit 200 and front surface 400f (third principal surface) of holder 400 face each other in the closed state.

In the closed state, keyboard unit side ribbed projections 214 (projections) that protrude at positions near a side away from hinge shafts 500 relative to end 400g (support end) of holder 400 are provided on upper surface 200a (second principal surface) of keyboard unit 200.

Relative displacement between tablet unit 100 and keyboard unit 200 caused by impact at a time of falling, for example, can be thereby suppressed. As a result, resistance to the impact at the time of falling, for example, can be further improved.

Other Exemplary Embodiments

The first exemplary embodiment has been described above as an example of the technique disclosed in the present disclosure. However, the technique of the present disclosure is not limited to the first exemplary embodiment, and also applicable to other exemplary embodiments that undergo some modifications, replacements, additions, and omissions, for example, as appropriate. In addition, new exemplary embodiments can also be achieved by combining the respective components described in the first exemplary embodiment. Thus, other exemplary embodiments will be described below as examples.

(1) In the above exemplary embodiment, a case where the electronic device according to the present disclosure is applied to tablet unit 100 has been described. Further, a case where the electronic device according to the present disclosure is applied to a detachable type computer configured such that tablet unit 100 (an example of a first unit) and keyboard unit 200 (an example of a second unit) are detachable has been described. However, the electronic device according to the present disclosure is also applicable to an ordinary undetachable notebook type computer in which a first unit and a second unit are directly coupled by hinges so as to be relatively rotatable.

(2) In the above exemplary embodiment, a case where the fitting part of the present disclosure is applied to tablet unit side fitting part 150 of tablet unit 100 has been described. However, the fitting part of the present disclosure may be applied to the fitting part of keyboard unit 200.

(3) In the above exemplary embodiment, housing 110 of tablet unit 100 and housing 210 of keyboard unit 200 are formed of resin or metal such as a magnesium alloy. However, metal other than the magnesium alloy may be used as metal as long as the metal has predetermined strength against impact or the like.

As described above, the exemplary embodiments have been described as examples of the technique of the present disclosure. For that purpose, the accompanying drawings and the detailed description have been provided. The components illustrated in the accompanying drawings and described in the detailed description may include components essential for solving the problems, as well as components that are not essential for solving the problems but required to exemplify the above techniques. Therefore, it should not be immediately construed that these components that are not essential are essential just because the components are described in the accompanying drawings and the detailed description. Since the above-described exemplary embodiments are for exemplifying the technique of the present disclosure, various modifications, replacements, additions, and omissions can be made within the scope of the claims or their equivalents.

INDUSTRIAL APPLICABILITY

The present disclosure is widely applicable to an electronic device having a lock mechanism that locks a first unit in a second unit.

What is claimed is:

1. An electronic device comprising:
a housing comprising metal that houses an electronic component;
a cover comprising resin that covers at least a part of a principal surface of the housing from an outside; and
a screw screwed into the housing via a through-hole provided at the cover, the screw having a head that protrudes to the outside of the cover beyond a principal surface of the cover,
wherein
a larger-diameter part having a diameter larger than a diameter of a screw part is provided on a head side of the screw, and
a larger-diameter step-down part that fits the larger-diameter part is provided on the principal surface of the housing.

2. The electronic device according to claim 1, further comprising a ring-shaped elastic member is provided between the through-hole of the cover and the larger-diameter part.

3. An electronic device comprising:
a first unit including a first electronic component and having a first principal surface;
a second unit including a second electronic component and having a second principal surface; and
a hinge that supports the first unit and the second unit relatively rotatably,
wherein
relative rotation of the first unit and the second unit forms a closed state where the first principal surface of the first unit and the second principal surface of the second unit face each other,
a fitting part provided on the first principal surface of the first unit and a first fitting part provided on the second principal surface of the second unit fit each other in the closed state, and
one unit of the first unit and the second unit includes
a housing comprising metal,
a cover comprising resin that covers at least a part of a principal surface of the housing from an outside, and a screw screwed into the housing via a through-hole provided at the cover and having a head that protrudes to the outside from the cover, a larger-diameter part having a diameter larger than a diameter of a screw part is provided adjacent to a head of the screw, a larger-diameter step-down part that fits the larger-diameter part is provided on the principal surface of the housing, and one of the fitting parts of the one unit includes a portion that protrudes to the outside of the head of the screw.

4. The electronic device according to claim 3, wherein a ring-shaped elastic member is provided between the through-hole of the cover and the larger-diameter part.

5. The electronic device according to claim 3, wherein a holder detachable from the first unit is coupled to the second unit via the hinge, and the hinge supports the first unit and the second unit attached to the holder relatively rotatably.

6. The electronic device according to claim 5, wherein the holder has a third principal surface that faces the second principal surface of the second unit in the closed state, and a second fitting part provided on the second principal surface of the second unit and a fitting part provided on the third principal surface of the holder fit each other in the closed state.

7. The electronic device according to claim 5, wherein the holder has a third principal surface that faces the second principal surface of the second unit in the closed state, and in the closed state, a projection that protrudes at a position near a side away from a hinge shaft of the hinge relative to a support end of the holder is provided on the second principal surface of the second unit.

\* \* \* \* \*